United States Patent
Uematsu

[11] Patent Number: 5,982,476
[45] Date of Patent: Nov. 9, 1999

[54] PROCESS OF FORMING PATTERN AND EXPOSURE APPARATUS

[75] Inventor: Masaya Uematsu, Kanagawa, Japan

[73] Assignee: Sony Corporation, Japan

[21] Appl. No.: 08/696,177

[22] Filed: Aug. 13, 1996

[30] Foreign Application Priority Data

Aug. 14, 1995 [JP] Japan ................................ 7-206886

[51] Int. Cl.$^6$ .......................... G03B 27/54; G03B 27/42; G03B 27/58
[52] U.S. Cl. .................. 355/67; 355/53; 355/47
[58] Field of Search ........................ 355/67, 53, 47, 355/30, 35, 5, 6, 9

[56] References Cited

U.S. PATENT DOCUMENTS

| | | | |
|---|---|---|---|
| 4,984,953 | 1/1991 | Nakazato et al. | 414/331 |
| 5,162,867 | 11/1992 | Kohno | 356/237 |
| 5,338,630 | 8/1994 | Yoon et al. | |
| 5,367,358 | 11/1994 | Kamon | 355/71 |
| 5,477,058 | 12/1995 | Sato | 355/53 |
| 5,617,181 | 4/1997 | Yanagihara et al. | 355/46 |
| 5,627,625 | 5/1997 | Ogawa | 355/53 |
| 5,677,757 | 10/1997 | Taniguchi et al. | 355/71 |
| 5,710,620 | 1/1998 | Taniguchi | 355/53 |
| 5,792,592 | 8/1998 | Uchida et al. | 430/313 |
| 5,829,868 | 11/1998 | Hutton | 362/276 |

FOREIGN PATENT DOCUMENTS 0 444 450  9/1991  European Pat. Off. .

*Primary Examiner*—Georgia Epps
*Assistant Examiner*—Timothy Thompson
*Attorney, Agent, or Firm*—Ronald P. Kananen; Rader, Fishman & Grauer

[57] ABSTRACT

A process of forming a pattern on a substrate by irradiating light for exposure from a light source to a mask to transfer the pattern of this mask onto the substrate, wherein, before forming the intended final pattern on the substrate, exposure is carried out with an inspection pattern to a diagnostic region in which the final pattern is not to be formed, the distribution of the intensity of light irradiated to the diagnostic region is found, and at least the secondary peak of this distribution of the light intensity is observed, whereby the light source conditions are optimized and the optimized condition light source is used for forming the pattern.

19 Claims, 18 Drawing Sheets

$d_{PR1} \neq d_{PR2}$

| NECESSARY D.O.F ($\mu$m) | RESOLUTION ($\mu$m) | OPTIMAL NA |
|---|---|---|
| 1.50 | 0.35 | 0.42 |
| 1.20 | 0.30 | 0.48 |
| 1.00 | 0.28 | 0.54 |
| 0.80 | 0.25 | 0.61 |

Cr MASK PROCESS
0.6 $\lambda$/NA HOLE PATTERN

HALFTONE PHASE SHIFT METHOD
0.6 $\lambda$/NA HOLE PATTERN

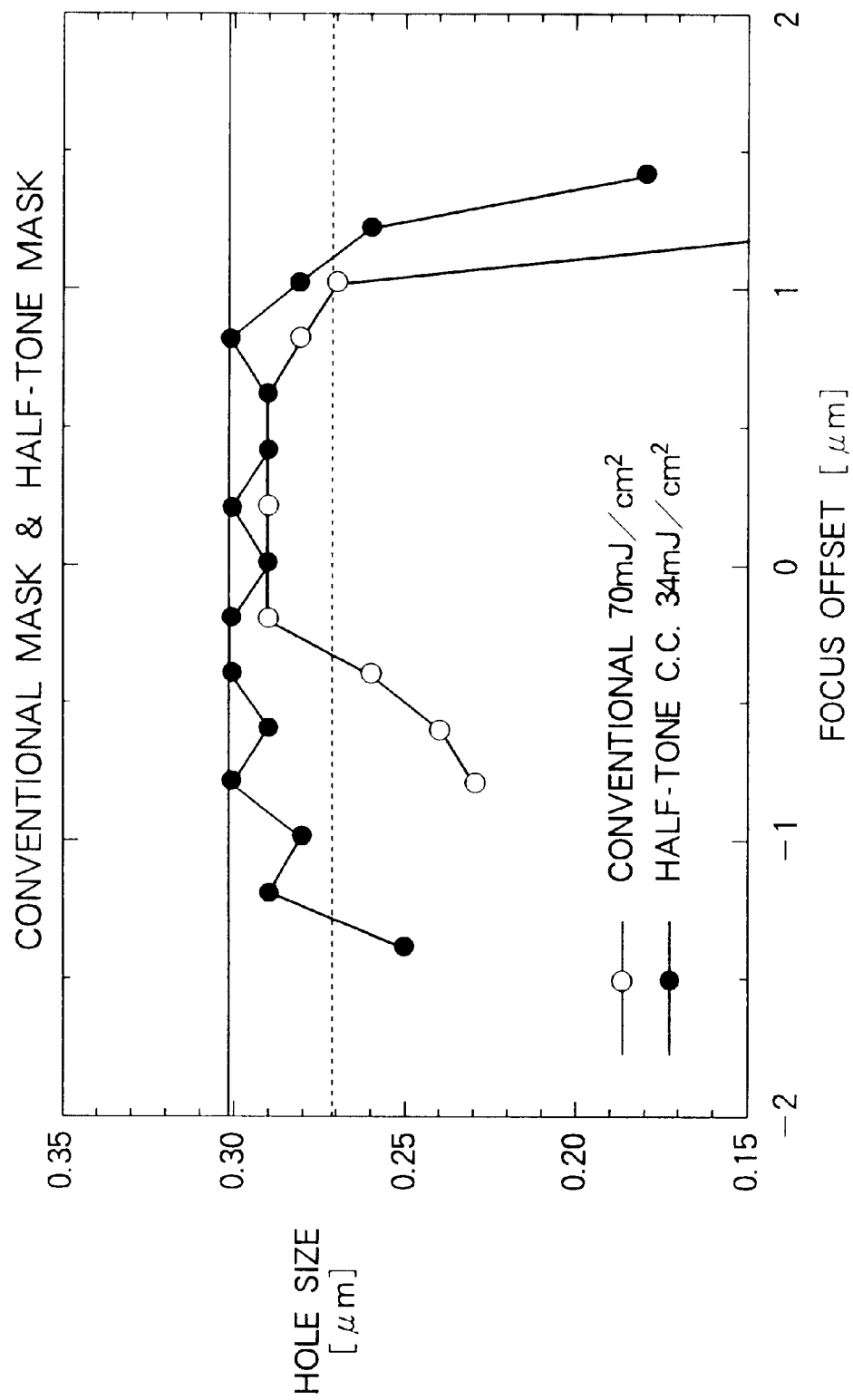

| | FIG. 8A<br>USUAL ILLUMINATION | FIG. 8B<br>MBI5 | FIG. 8C<br>RING BELT ILLUMINATION |
|---|---|---|---|
| DISTRIBUTION OF LIGHT INTENSITY OF LIGHT SOURCE | 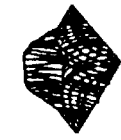 | 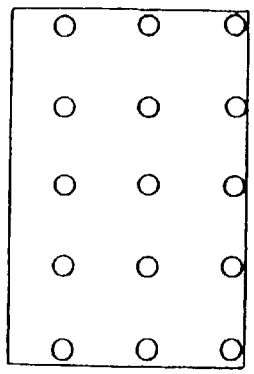 | 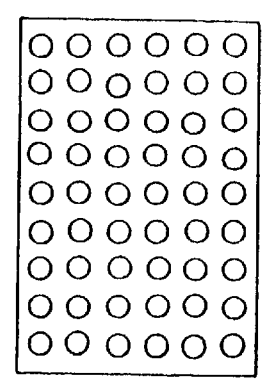 |
| DUTY RATIO 1:3 | 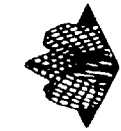 | 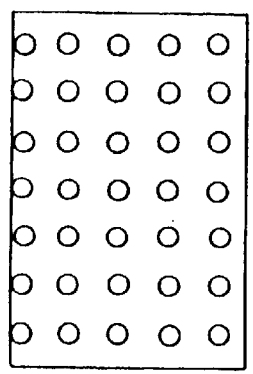 | 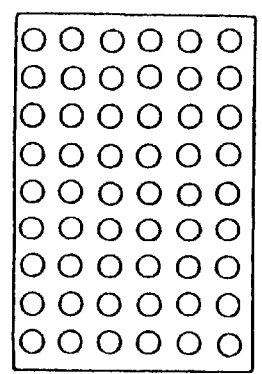 |
| 1:1.5 | 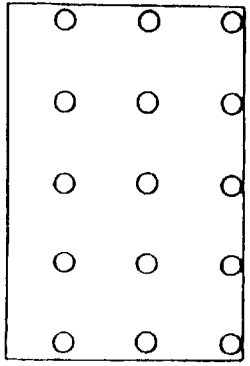 | 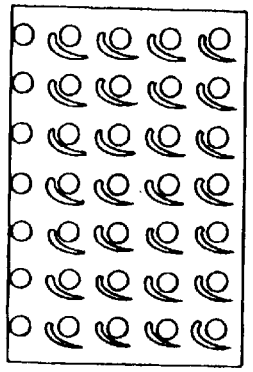 | 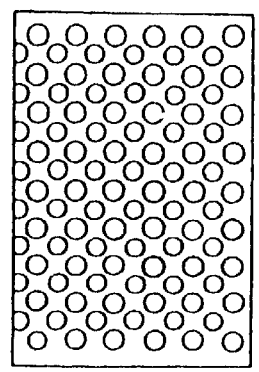 |
| 1:1 | | | |

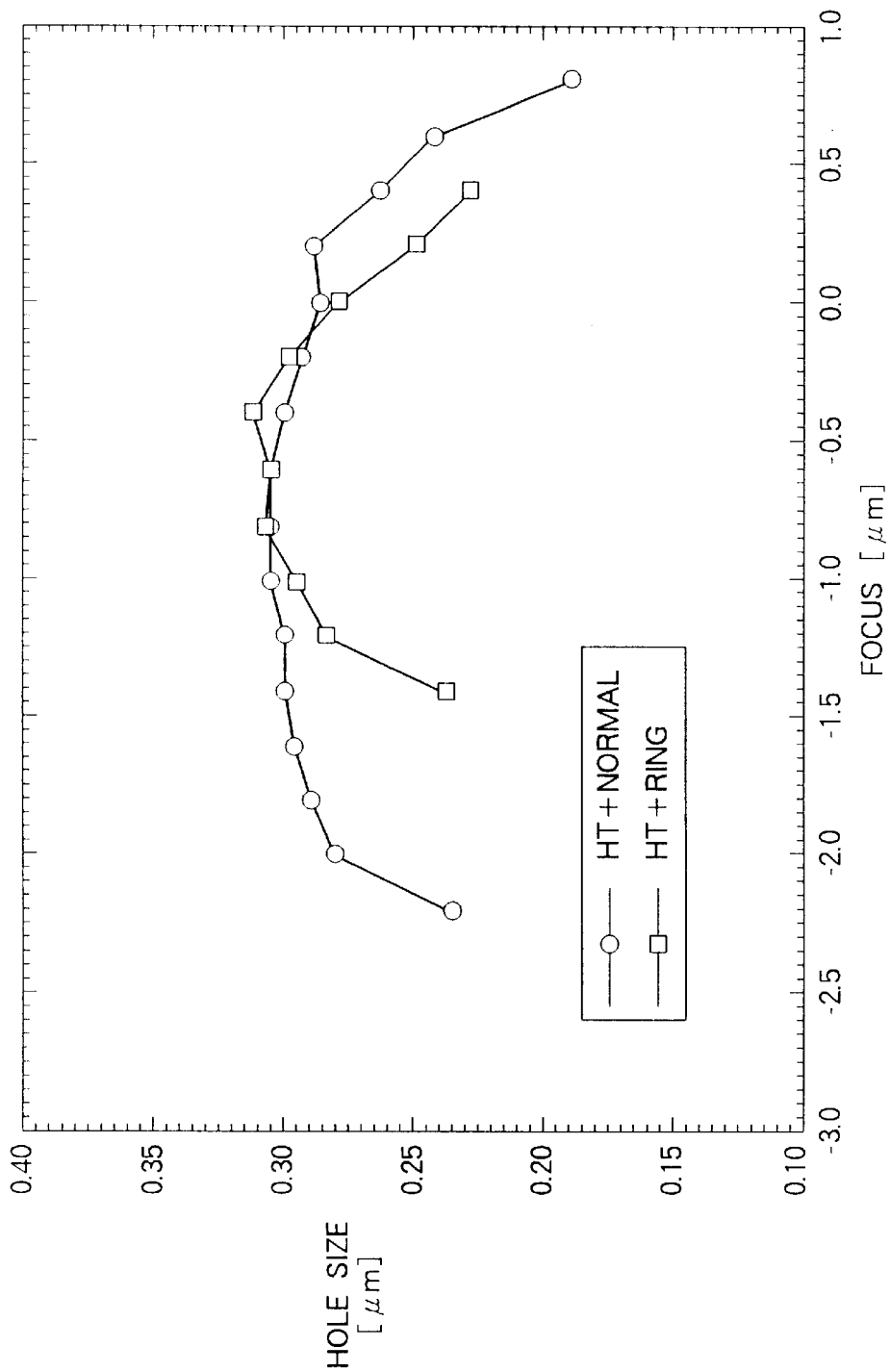

```
                 <<<        >>>
  0000000000000000000000000000000000000000000000000000000000000000000
  000000000000000000000000000000000011!!1!111!1111000000000000000000000000000000
  000000000000000000000000000000000111111111!11!1!111111100000000000000000000000
  0000000000000000000000000000000666666622~~~~~~256666600000000000000000000000000
  00000000000000000000000000000006666666222~~~~~~2566666660000000000000000000000
  0000000000000000000000000000006777777766663333333666677777776000000000000000000
  00000000000000000000000000000077777777776663333366677777777770000000000000000000
  0000000000000000000000000000007778888886777666444666777888888377700000000000000000
  000000000000000000000000000077788888887776664666677788888887770000000000000000
  0000000000000000000000000006778889999888776665666778889999988776000000000000000
  00000000000000000000000000077888999998877665667788899999888770000000000000000
  000000000000000000000000006778899*99988776656677889*999887760000000000000000
  0000000000000000000000000066778899**9988776655677889**99887760000000000000000
  0000000000000000000000000066778899**9988776655677889**99887660000000000000000
  000000000000000000000000166778899999988776655677889999887761000000000000000
  0000000000000000000000016677888999999887766566778889999998877661000000000000000
  0000000000000000000000166778889999988877665566677888999998877661000000000000000
  00000000000000000000011666777888888877766555667778888888777666110000000000000000
  0000000000000000000001122667778888877766655556667778888877766621000000000000000
  00000000000000000000011226667777777666554556667777777776662~1000000000000000000
  0000000000000000000001122366677777766665444456666777776663~~100000000000000000
  00000000000000000000112~23666666666654443446566666666663322~100000000000000000
  0000000000000000000011~2~346666666655544333445566666666664332~~100000000000000000
  00000000000000000000112~~3445555555544~~23~455555555554432~~100000000000000000
  00000000000000000000112~~346666666665554432344556666666664332~~100000000000000000
  0000000000000000000011~~23666666666665443444566666666666663322~100000000000000000
  00000000000000000000112~2366677777766665444456666777776663~~100000000000000000
  00000000000000000000112~2566677777777666554556667777777776662~1000000000000000000
  000000000000000000001126667778888877766655556667778888877766621000000000000000
  00000000000000000000011666777888888877766555667778888888777666110000000000000000
  0000000000000000000001166778889999888776665666778889999988776661000000000000000
  0000000000000000000001667788899999888776665666778889999988776661000000000000000
  000000000000000000000166778889999988877665566677888999998877661000000000000000
  00000000000000000000006677889*9998877665566778899*999887766000000000000000
  000000000000000000000066778899**9988776655677889**99887660000000000000000
  000000000000000000000066778899**9988776655677889**99887660000000000000000
  000000000000000000000077888999999887766566778899998877000000000000000
  00000000000000000000006778889999988877665566677888999988776000000000000000
  000000000000000000000007788888887776664656677888888887770000000000000000
  0000000000000000000000007778888887776664556677788888877700000000000000000
  00000000000000000000000007777777776666333366677777777770000000000000000
  0000000000000000000000000067777776666333333666677777776000000000000000000
  0000000000000000000000000000666666622~~~~~~2566666660000000000000000000000
  0000000000000000000000000000066666622~~~~~~25666666600000000000000000000000
  00000000000000000000000000000000000111!!11!!!1!111110000000000000000000000000
  000000000000000000000000000000000011!!!!!!!!!111100000000000000000000000000000
  0000000000000000000000000000000000000000000000000000000000000000000000000
```

ON PRISM

ON FLY-EYE LENS

ON PRISM

ON FLY-EYE LENS

FIG. 19A  FIG. 19B
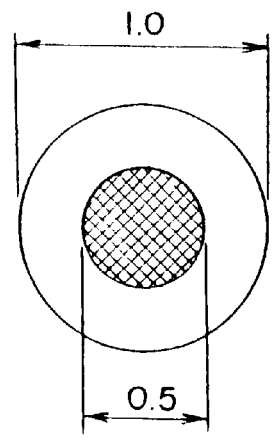
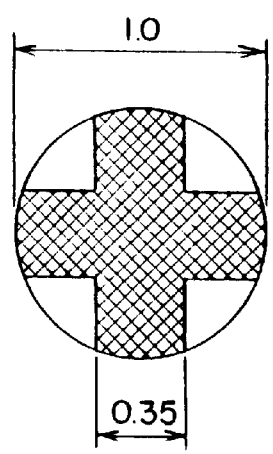
FIG. 20
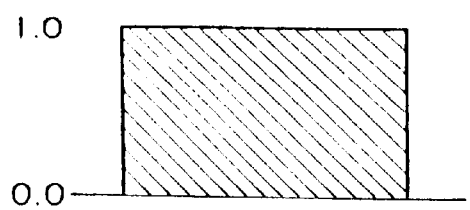
FIG. 21
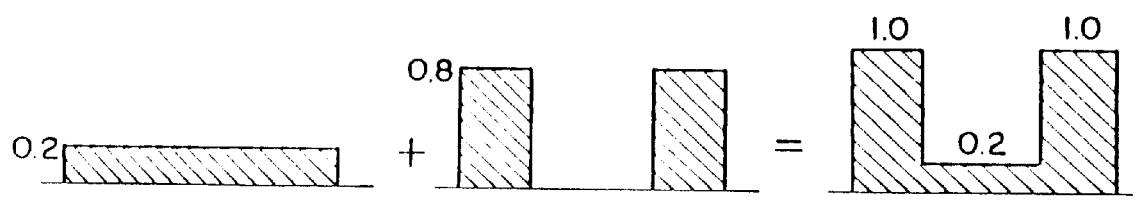

PROCESS OF FORMING PATTERN AND EXPOSURE APPARATUS

BACKGROUND OF THE INVENTION

1. Field of the Invention

The present invention relates to a process for the formation of a pattern by which a pattern can be formed under optimum light source conditions giving little disadvantage of the secondary peak even if for example a phase shift mask is used and to an exposure apparatus.

2. Description of the Related Art

At present, in the research and development of semiconductor integrated circuits, devices of a design rule of a sub-half micron area are being researched and developed. In the development of these devices, photolithographic technology is indispensable. It is not too much to say that the resolution performance of the exposure apparatus used in this photolithographic technology, i.e., the so-called "projection aligners" (reduction, projection, and exposure apparatuses), governs the success of the research and development of semiconductor devices and the possibility of their mass production.

The resolution performance of the projection aligners has been improved by making the NA of the reducing and projecting lens larger or making the exposure waveform shorter based on the Reyleigh equation. In the fabrication of a semiconductor device, however, there are step differences caused due to the topography, wafer flatness, etc. of the semiconductor device, therefore not only the resolution performance, but also the ensurement of the depth of focus are important parameters. The dimensional precision of the resist pattern in the photolithographic process in the fabrication of a semiconductor device is generally ±15 percent. In an actual device, as shown in FIG. 1, unevenness always occurs on the surface of the semiconductor substrate S. For example, a projecting portion In of as polycrystalline silicon etc. exists. As a result, the pattern of the resist PR is not formed at the same focal plane. For this reason, the dimensions of the pattern of the resist PR become different between the upper portion and lower portion of the step difference. Of course, this becomes conspicuous as the pattern becomes finer where steppers having the same waveform and same numerical aperture are used. This tendency is commonly seen in all types of resists.

The depth of focus becomes smaller primarily in proportion to the exposure waveform and inversely in proportion to the square of the NA. In a mass production process, a depth of focus of about 1.5 $\mu$m is necessary. For this reason, there is a limit to which both of the resolution performance and depth of focus which are required can be satisfied.

FIGS. 2A and 2B are views of the NA dependency when the resolution performance of the depth of focus (DOF) in KrF excimer laser lithography, which is the latest exposing process, is used as a parameter. As understood also from the figures, the highest resolution to be obtained after satisfying the required depth of focus of 1.5 $\mu$m is about 0.35 $\mu$m. Accordingly, it is extremely difficult to resolve a line width of 0.35 $\mu$m or less while having a depth of focus of 1.5 $\mu$m or more. Some technologies for increasing the depth of focus are necessary.

In order to respond to such requirements, a halftone type phase shift method has been proposed in recent years. This exposure process is an extremely useful process for improving the degree of resolution and depth of focus of an isolated pattern such as contact holes. In the halftone type phase shift process, as shown in FIG. 3, semi-transparent $Cr_xO_y$, $Si_xN_y$, $SiO_xN_y$, $Mo_xSi_y$ films, etc. which have a transmittance of about several percentages to about 20 percent with respect to the light for exposure, that is, which transmit a minute amount of light for exposure therethrough, are used as the halftone film 2 corresponding to a dark portion 1. In a bright portion 3, both of the film 2 and the transparent substrate (on which the recessed portion 5 is formed) or only the film 2 is etched and made to act as a mask. At this time, by setting the phase difference between the bright portion 3 and the dark portion 1 formed by the semi-transparent film to 180°, as shown in FIG. 4B, the gradient of the distribution of the light intensity in the isolated pattern (for example a hole pattern of 0.6 $\gamma$/NA) can be made sharp. Note that, FIG. 4A is a view of the distribution of the light intensity in an isolated pattern using a chromium mask in related arts.

FIG. 5 is a view of a result of experiments to show that the DOF is greatly improved when using a phase shift mask so as to form an isolated contact hole. The black dots in FIG. 5 is a view of the case where the phase shift mask is used, and the white dots show the case where a chromium mask of related arts is used.

In the design of this phase shift mask, the transmittance of the halftone film 2 shown in FIG. 3 is an important element. Namely, in order to make the gradient of the distribution of the light intensity in the isolated pattern sharper, it is sufficient to raise transmittance of the halftone film 2. However, by raising the transmittance, the light blocking effect by the halftone film 2 is weakened, and the whole surface of the resist is exposed.

Also, usually, at the formation of the pattern, on the two sides of the position of the desired pattern in the distribution of the light intensity, irrespective of the light blocking position, as shown in FIG. 6, a secondary peak called a side lobe is caused due to the proximity effect. The secondary peak is enhanced by raising the halftone transmittance. As shown in FIG. 7, even in so-called completely isolated contact holes in which the adjoining patterns are spaced apart from each other by 3W or more where the design dimension of for example the hole pattern 6 is W, the peripheral portions end up with a "gouged" shape (reference numeral 8 part). In the shape shown in FIG. 7, there is a concern that the diameter of the contacts will be enlarged in the etching step.

Further, when it is intended to apply the halftone phase shift mask process to a so-called repeated pattern portion having a high pattern density, the secondary peak is emphasized by the mutual interference of adjoining patterns, that is, the mutual proximity effect in a so-called repeated pattern portion having a high pattern density, and therefore becomes more conspicuous.

Accordingly, when it is intended to form the device pattern by using the halftone phase shift mask process, a design and CAD step must be carried out while sufficiently considering the distance between patterns. An enormous load is placed on the design and CAD step, and practical use is obstructed.

In order to suppress the resolution of the secondary peak, it is sufficient if the light intensity of the secondary peak is lowered to an extent that the resolution does not occur. The light intensity of the secondary peak depends upon the light intensity of the center portion of the light source. Therefore, a process of suppressing the resolution of the secondary peak by lowering the light intensity of the center portion of the light source is proposed.

In this way, it was confirmed by experiment that, according to the process of exposure lowering the light intensity of the center portion of the light source and using a phase shift mask, the secondary peak is not resolved by a light source having a distribution of the light intensity of a usual Gaussian distribution even if the pattern interval of the contact holes is narrower than that of the exposure process.

For example, FIG. 8B is a view of an example in which a pattern of contact holes having an inner diameter of 0.30 μm is formed on the substrate by a KrF excimer laser stepper having an NA of 0.45 by using a effective light source having a low light intensity at the center portion and halftone phase shift mask. In this experiment, chemical amplification type positive resist (WKR-PT2) was used as the resist. Contact hole patterns were formed for patterns in which the ratio of the inner diameter of the contact holes and the interval between them (duty ratio) was changed to 1:3, 1:1.5, and 1:1. The results of SEM photographs are shown in FIG. 8B.

Also, for comparison, contact hole patterns were formed under three types of conditions in the same manner except that the distribution of intensity of light irradiated onto the fly-eye lens was made the Gaussian distribution shown in FIG. 8A. Further, for comparison, contact hole patterns were formed under three types of conditions in the same manner except that the distribution of intensity of light irradiated onto the effective light source was made the distribution of the ring belt illumination (the light intensity of the center portion was set to 0). The results by observation by SEM photographs are shown in FIG. 8C. It was confirmed from the results of these experiments that the secondary peak was almost not isolated by the exposure having a light source with a distribution where the light intensity was weak at the center portion (FIGS. 8B and 8C) even if the interval between the contact holes became narrow.

Where it is intended to form a pattern of isolated contact holes, however, as shown in FIG. 9, in the combination (○ in the figure) of the ring belt illumination and the halftone phase shift mask, the DOF is lowered (the width of the focus becomes narrow in the figure) compared with the combination between the usual illumination and the half tone phase shift mask (□ in the figure).

Namely, the resolution of the secondary peak can be suppressed by lowering the light intensity of the center portion of the light source, but when it is lowered too much, the effect of the halftone phase shift mask is reduced. Also, as shown in FIGS. 8A to 8C, it is seen that the degree of resolution of the secondary peak differs depending upon the interval of the patterns. Accordingly, it is necessary to optimize the conditions such as the distribution of the light intensity of the light source so as to suppress the resolution of the secondary peak, but not reduce the effect of the phase shift mask.

SUMMARY OF THE INVENTION

An object of the present invention is to provide a process of forming a pattern with which the pattern can be formed under the optimum light source conditions with little disadvantage of a secondary peak even if for example a phase shift mask is used and to provide an exposure apparatus using the same.

According to the present invention, there is provided a process of forming a pattern on a substrate, by exposing a light emitted from a light source to a mask to transfer a pattern of the mask onto a substrate to thereby form a final pattern on the substrate, the process including the steps of: defining a region in the substrate on which the pattern is not formed as a diagnostic region and transferring an inspection pattern on the diagnostic region by exposure; finding the distribution of the intensity of the exposure light transferred to the diagnostic region and observing at least a secondary peak of the distribution of light intensity; optimizing the operational condition of the light source so as to reduce the distribution of light intensity of the secondary peak; forming a photoresist layer on the substrate; using the light emitted from the light source which operates under the optimized condition performing the exosure to the photoresist layer to transfer a final pattern thereon; and developing the photoresist layer to which the final pattern has been transferred.

Preferably, the inspection pattern is formed in a different mask from the mask for forming the final pattern.

Preferably, the inspection pattern is formed on the same mask as the mask for forming the final pattern and at the periphery of the pattern.

Preferably, the inspection pattern comprises the same pattern as the final pattern.

Preferably, the mask is a phase shift mask.

Further preferably, the diagnostic region is made of a photochromic material, the color change of the surface of the material caused by the distribution of the intensity of the light for exposure irradiated to the photochromic material is photographed, and the light intensity of the secondary peak is detected based on the result of the photographing.

Preferably, the diagnostic region is formed as a photographic means which can detect the two-dimensional distribution of the light intensity and the image photographed by the photographic means is used to detect the light intensity of the secondary peak.

Further preferably, the diagnostic region is the periphery of the substrate on which the final pattern is to be formed and the reflected light of the inspection pattern irradiated on the diagnostic region is photographed so as to detect the light intensity of the secondary peak.

According to the present invention, there is provided a process of forming a pattern including the step of optimizing the operational condition of the light source further includes the steps of: changing the distribution of the light intensity from the light source so that the light intensity of the secondary peak becomes a predetermined value or less and determining conditions of a light source having an optimal distribution of the light intensity giving not more than the predetermined value; and adopting said light source having an optimal distribution of the light intensity as the light source for the exposure light.

Preferably, the step of optimizing the operational condition of the light source further includes the steps of: changing the distribution of the light intensity from the light source so that the primary peak of the distribution of intensity of the light for exposure irradiated to the diagnostic region becomes a predetermined value or more and determining conditions of a light source having an optimal distribution of the light intensity giving not more than the predetermined value; and adopting said light source having an optimal distribution of the light intensity as the light source for the exposure light.

Preferably, the step of optimizing the operational condition of the light source further includes the steps of: exposing the light for exposure under a plurality of focus conditions, when irradiating the light for exposure to the diagnostic region; changing the distribution of the light intensity from the light source so that the light intensities of the secondary peaks detected under the different conditions become overall not more than a predetermined value, when irradiating the light for exposure under these plurality of focus conditions; and adopting a distribution of the light intensity of the light source giving an overall value of the distribution of light intensities of the secondary peaks of not more than a predetermined value as the optimum distribution of the light intensity of the light source.

Further preferably, a process of forming a pattern according to the present invention including the steps of: irradiating the light for exposure by using a plurality of inspection patterns, when irradiating the light for exposure to said diagnostic region; changing the distribution of the light intensity from the light source so that the light intensities of the secondary peaks detected under the different conditions become overall not more than the predetermined value; and adopting a distribution of the light intensity of the light source giving an overall value of the distribution of light intensities of the secondary peaks of not more than a predetermined value as the optimum distribution of the light intensity of the light source.

According to the present invention, there is provided an exposure apparatus comprising: a light source for emitting light for exposure; a light source changing means for changing the distribution of intensity of the light emitted from the light source; a secondary peak detecting means for detecting the secondary peak of the light for exposure irradiated on a diagnostic region, which is not formed a pattern and on which the light for exposure from said light source is irradiated through a mask so as to diagnose the distribution of light intensity of said light for exposure.

Preferably, the light source comprises an effective light source.

Preferably, the mask comprises a phase shift mask.

Preferably, the diagnostic region is made of a photochromic material and said apparatus further comprises a photographic means for photographing the change of color of the surface of the material based on the distribution of intensity of the light for exposure irradiated to the photochromic material and of a secondary peak detecting means for detecting the light intensity of the secondary peak based on the result of the photographing of the photographic means.

Preferably, the diagnostic region is constituted by a photographic means which can detect the two-dimensional distribution of the light intensity and the apparatus further comprises a secondary peak detecting means for detecting the light intensity of the secondary peak based on the image photographed by the photographic means.

Preferably, the diagnostic region of the exposure apparatus is formed on the periphery of the substrate on which the final pattern is to be formed and the apparatus further comprises a secondary peak detecting means for detecting the light intensity of the secondary peak by photographing the reflected light of the inspection pattern irradiated on the diagnostic region.

Preferably, the exposure apparatus further comprises a controlling means for changing the distribution of the intensity of the light from the light source by the light source changing means so that the light intensity of the secondary peak becomes not more than the predetermined value.

Preferably, the exposure apparatus further comprises a controlling means for changing the distribution of the intensity of the light from the light source by the light source changing means so that the primary peak of the distribution of intensity of the light for exposure irradiated to the diagnostic region becomes not less than a predetermined value.

Preferably, light source changing means of the exposure apparatus comprises the means for lowering the amount of light emitted from the center portion of the effective light source to be equal to or lower than the amount of light emitted from the peripheral portion of the effective light source by a predetermined amount.

Preferably, the light source changing means of the exposure apparatus comprises a means for making the amount of light emitted from the center portion of the effective light source lower than the peak value of the amount of light emitted from the peripheral portion of the effective light source by 0 to 90 percent.

Preferably, the effective light source of the exposure apparatus compeises a fly-eye lens comprised of an assembly of a plurality of lenses and the light emitted from the light source is passed through the fly-eye lens to irradiate the effective light.

Preferably, the light source changing means of the exposure apparatus has an optical element and optical components arranged so as to be able to be moved toward or away from the optical element in an axial direction of the light path.

Preferably, the optical element of the exposure apparatus comprises a prism.

Preferably, the light source changing means of the exposure apparatus has a means for dividing a beam incident upon the effective light source into two or more beams, a moveable mirror for irradiating the two or more divided beams onto the effective light source, and a scanning means for lowering the amount of light emitted from the center portion of the effective light source with respect to the peak value of the amount of light emitted from the peripheral portion of the effective light source by utilizing the difference of the scanning speed at different points of the surface of the effective light source caused by the surface shape of the moveable mirror.

Preferably, the light source changing means of the exposure apparatus has a first filter having a higher transmittance at the peripheral portion than at the center portion and a switching means for switching between a state where the light is passed through said first filter and a state where the exposure is carried out without passing the light through this first filter within a single exposure time.

Preferably, the exposure apparatus further comprising a second filter having a distribution of transmittance different from that of the first filter and wherein in a state where the exposure is carried out without passing the light through the first filter, the switching means is controlled so as to pass the light through the second filter.

Preferably, the switching means of the exposure apparatus has at least a rotary disk on which the first filter is mounted and a driving means for driving the rotary disk to rotate.

Preferably, the switching means of the exposure apparatus has at least a slide mechanism by which the first filter can move in a sliding manner.

Preferably, the switching means of the exposure apparatus is formed by a light shutter type optical material with a transmittance of light which gchanges by application of a voltage.

BRIEF DESCRIPTION OF THE DRAWINGS

The above and other objects and features of the present invention will be described more in detail with reference to the accompanying drawings, in which:

FIG. 5 is a graph showing an example of an experiment in which the DOF is improved by using the phase shift mask;

FIG. 8A to 8C are graphs of a pattern of holes showing the influence of the secondary pattern by the distribution of the light intensity of the light source;

FIG. 9 is a graph showing the result where the DOF becomes narrow where the halftone phase shift mask is used;

FIG. 15A is a view of the state before superimposing it and FIG. 15B is a view of the state after superimposing it;

FIGS. 19A and 19B are views of examples of the filter used in the embodiments;

FIG. 20 is a view of the distribution of the light intensity used in the embodiments;

FIG. 21 is a conceptual view of the addition of the distribution of the light intensity.

DESCRIPTION OF THE PREFERRED EMBODIMENTS

Below, preferred embodiments of an exposure apparatus and a process of forming a pattern according to the present invention will be explained in detail with reference to the drawings.

First Embodiment

Figure 1:
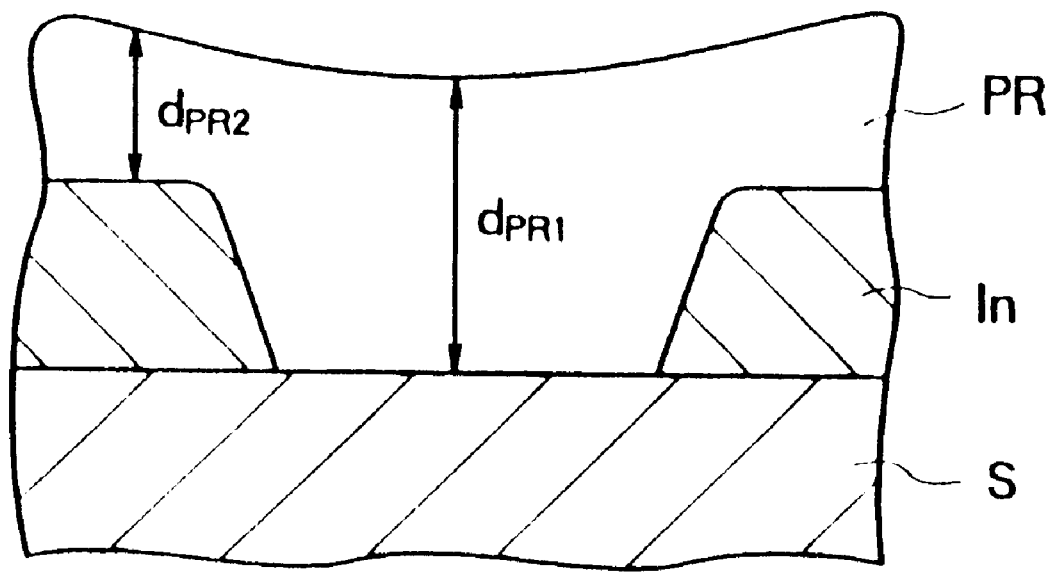
FIG. 1 is a view of an unevenness always exists on the surface of a substrate of an actual device.
Figures 2A, 2B:
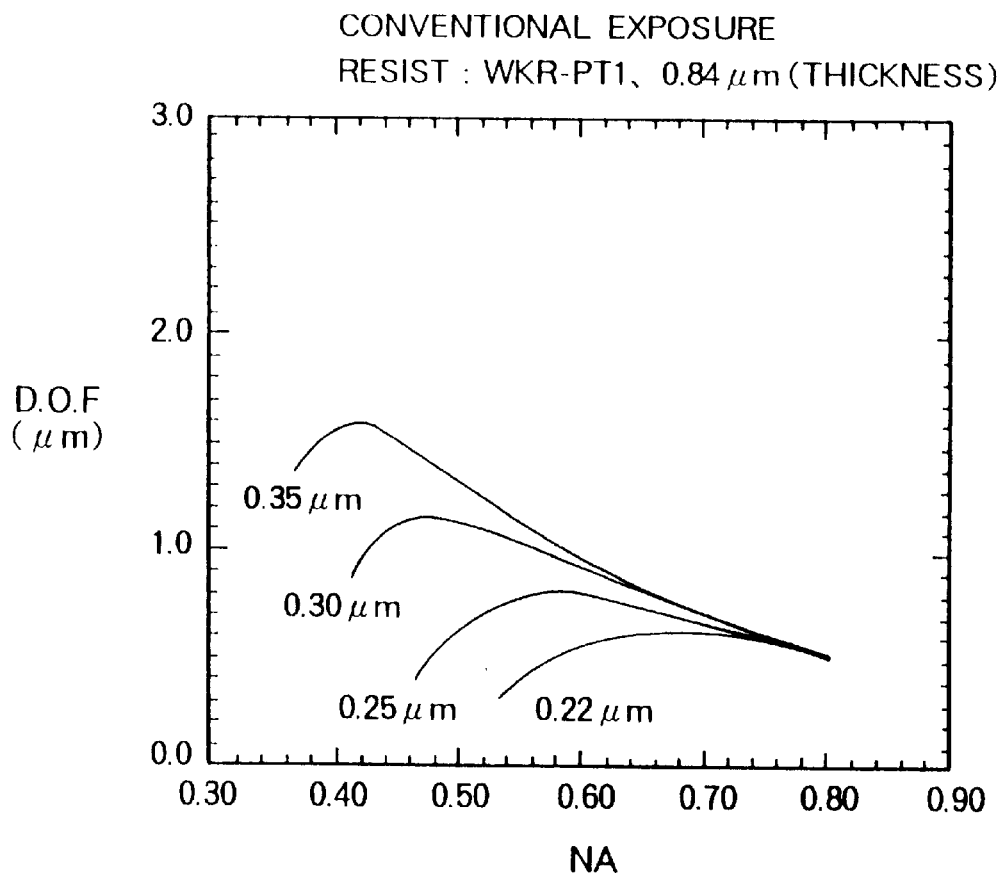
FIG. 2A is a graph showing the NA dependency when using the resolution performance of the depth of focus in KrF excimer laser photolithography as a parameter.
FIG. 2B is a view showing the data of FIG. 2A.
Figure 3:
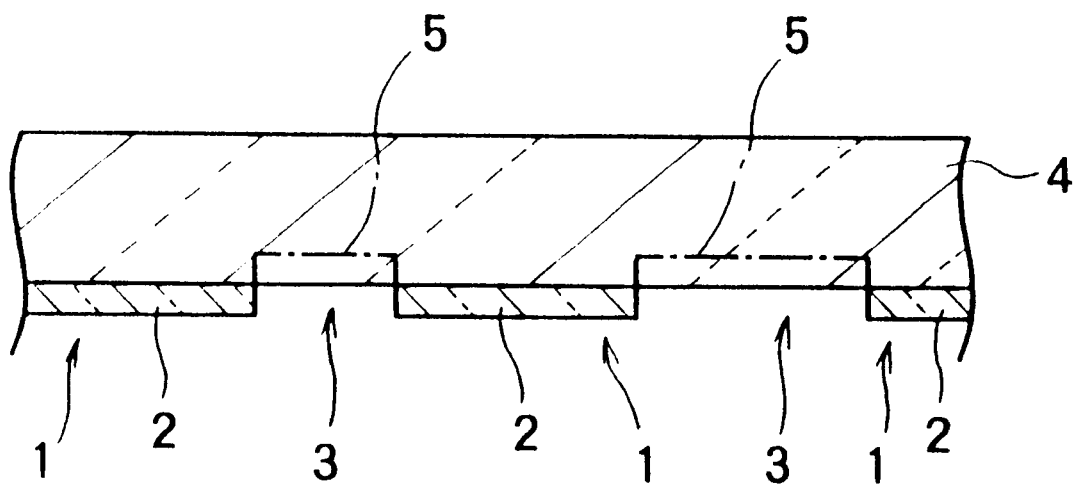
FIG. 3 is a sectional view of a phase shift mask to be used in a halftone type phase shift method.
Figure 4A:
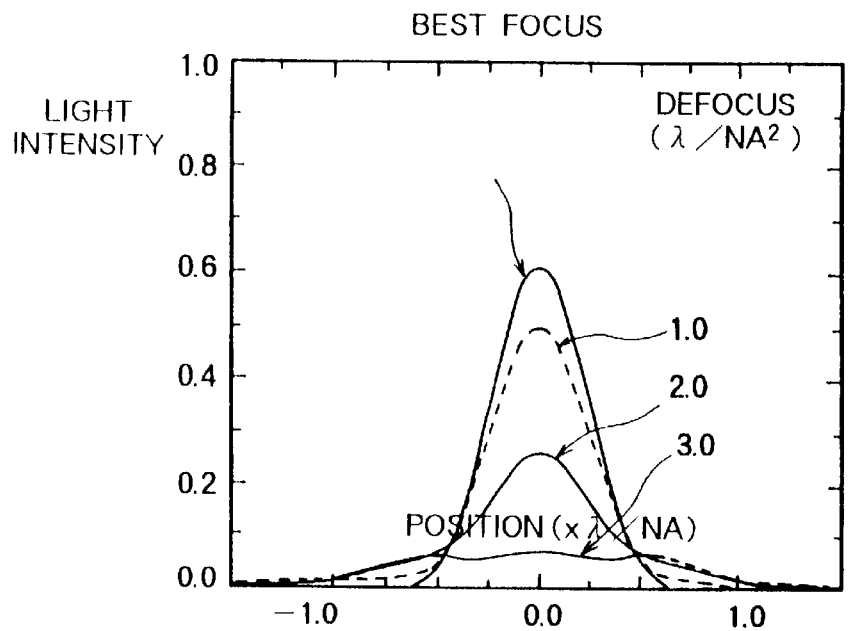
FIG. 4A is a graph showing a distribution of the light intensity on a wafer surface according to the chromium mask method.
Figure 4B:
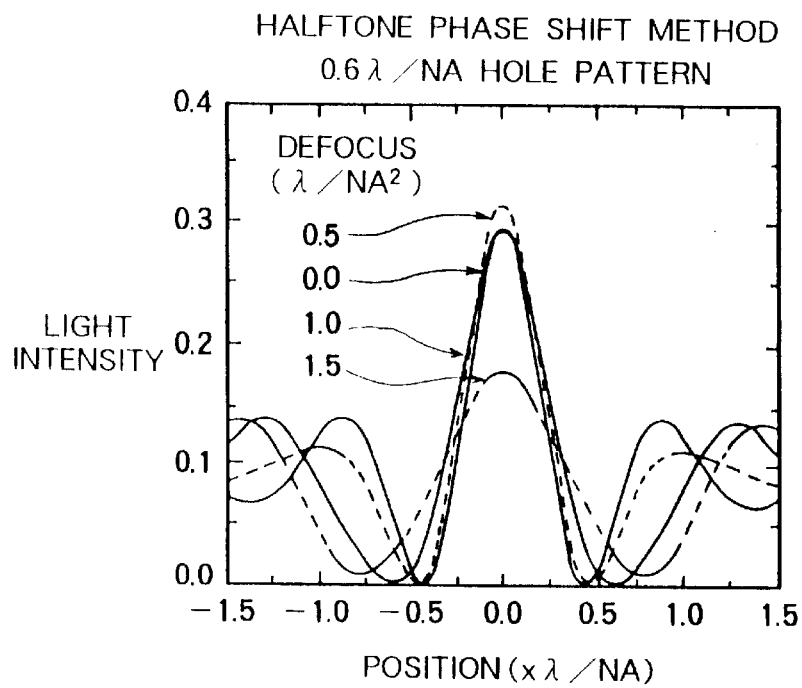
FIG. 4B is a graph showing the distribution of the light intensity on the wafer surface according to the halftone phase shift method.
Figure 6:
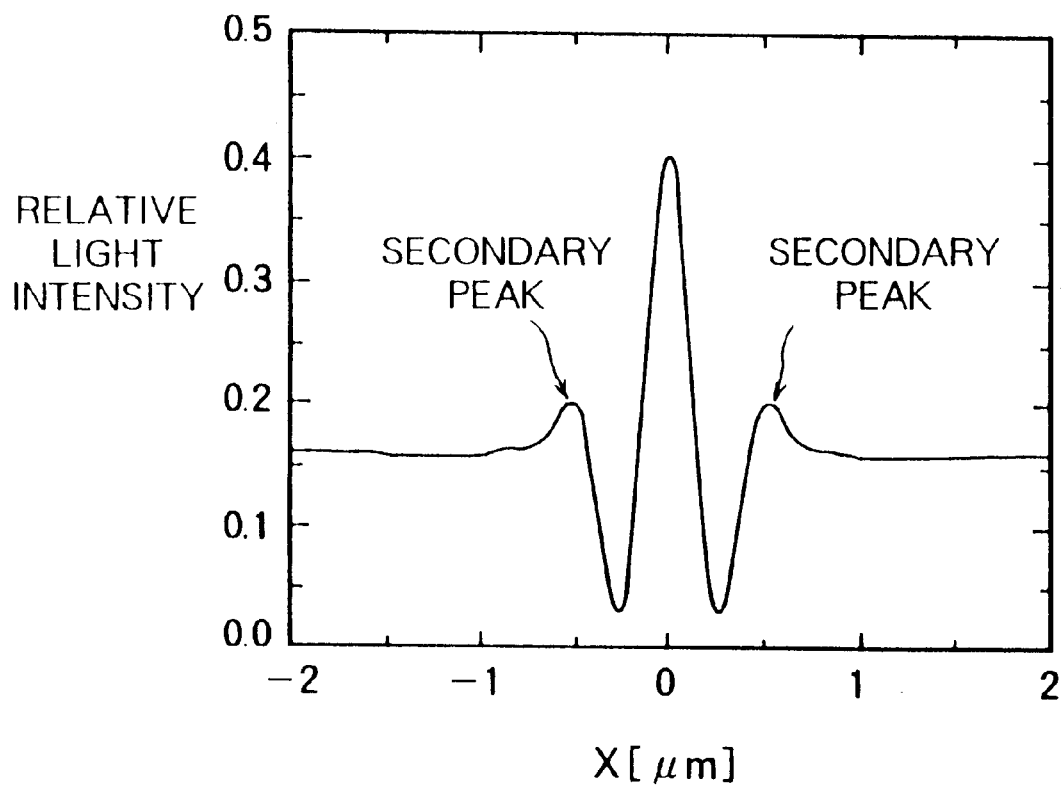
FIG. 6 is a graph showing the existence of a secondary peak by the halftone phase shift method.
Figure 7:
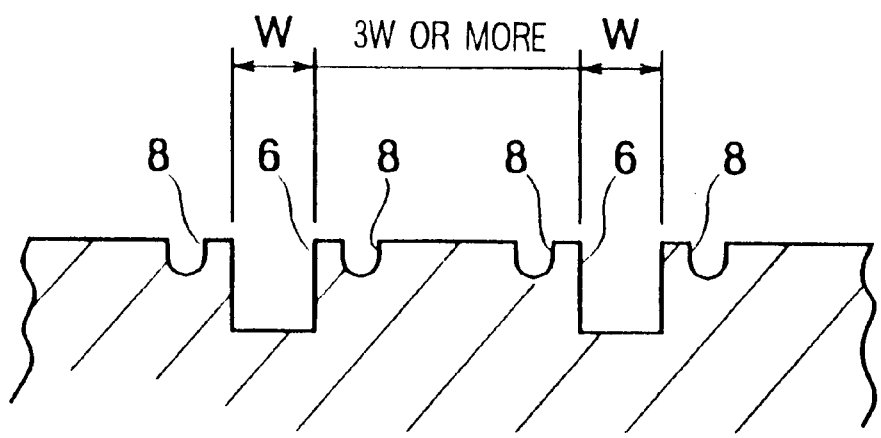
FIG. 7 is a sectional view showing that the peripheral portions exhibits a "gouged" shape by the secondary peak also in the isolated contact hole.
Figure 10:
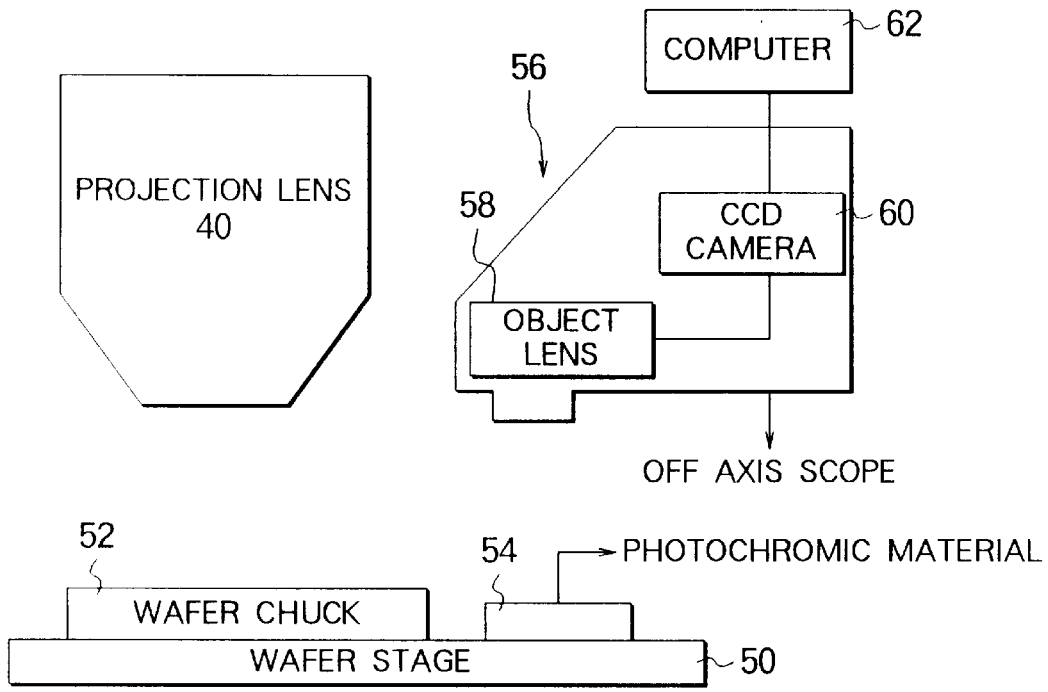
FIG. 10 is a conceptual view of the principal parts of an exposure apparatus according to an embodiment of the present invention.
Figure 11:
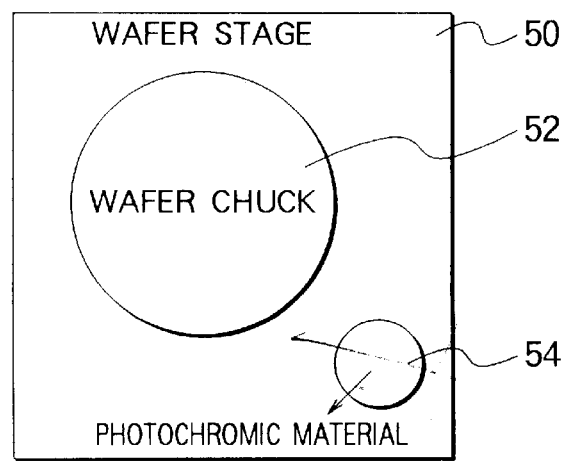
FIG. 11 is a partial plan view of FIG. 10.
Figure 12:
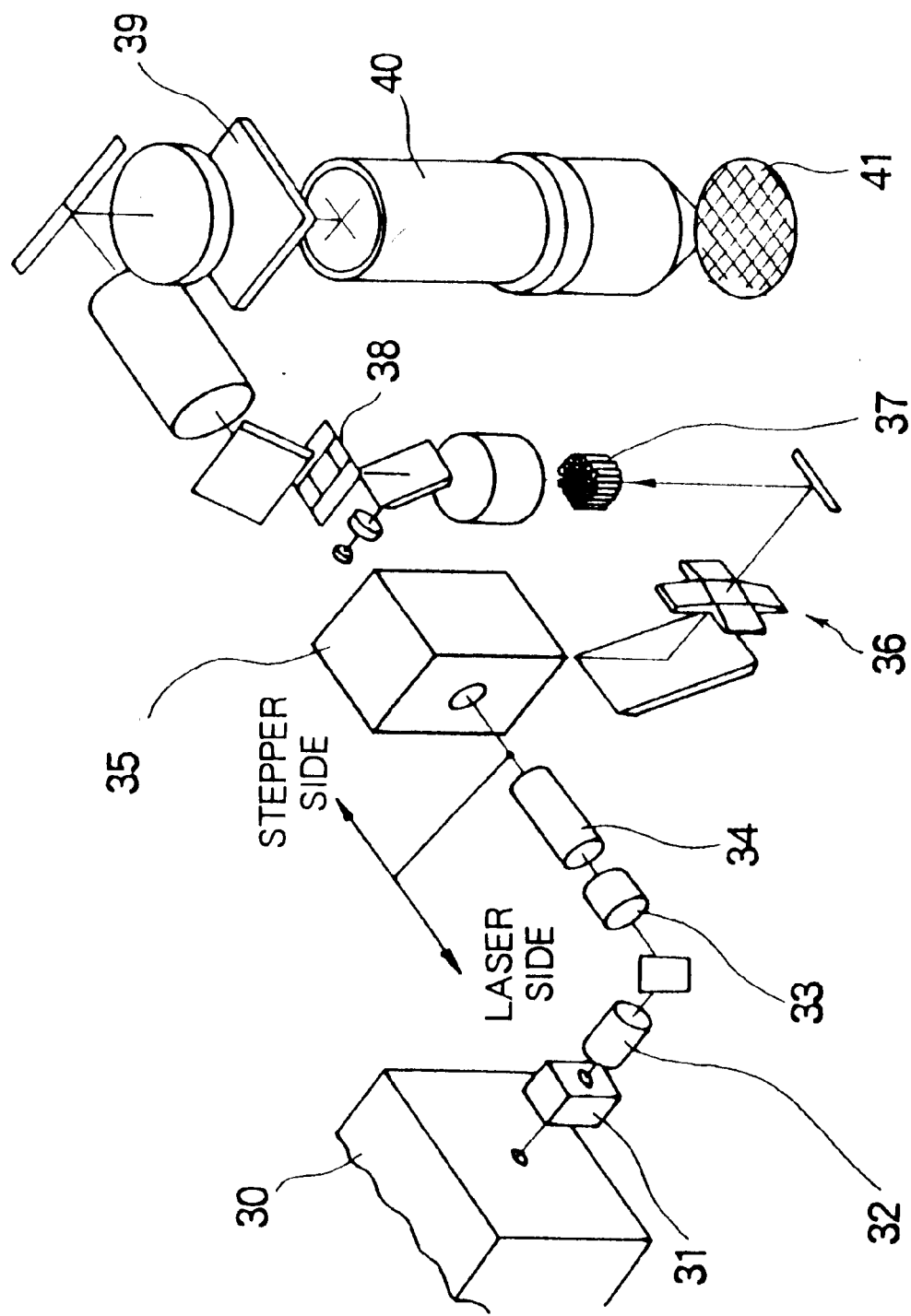
FIG. 12 is a conceptual view of the overall entire configuration of the exposure apparatus.

A first embodiment is an example in which the optimization of the light source is achieved by using the exposure apparatus shown in FIGS. 10 to 12 so as to stably transfer a semiconductor device pattern by using a halftone phase shift mask.

First the overall configuration of the exposure apparatus will be explained based on FIG. 12.

As shown in FIG. 12, this exposure apparatus comprises a laser device and a stepper device. The laser device is constituted by an excimer laser 30, a dosage controlling unit 31, a shifting unit 33, and an emitting optical system 34.

The stepper device is constituted by a beam splitter 35, a prism unit 36, a fly-eye lens 37, a masking blade 38, a reticle 39, and a projection lens 40. The light for exposure emitted from the excimer laser 30 is made incident upon the fly-eye lens 37 through the various optical systems. The fly-eye lens 37 becomes the secondary light source (effective light source). That exposure light reaches the top of the surface of the wafer 41 through the reticle 39 on which the mask pattern is formed, whereby the pattern of the reticle 39 is transferred onto the wafer surface. In the present embodiment, a phase shift mask is used as the reticle 39.

The fly-eye lens 37 is an assembly of a plurality of (for example 100) lenses and has an overall outer diameter usually of 5 cm to 20 cm.

Figures 13A, 13B:
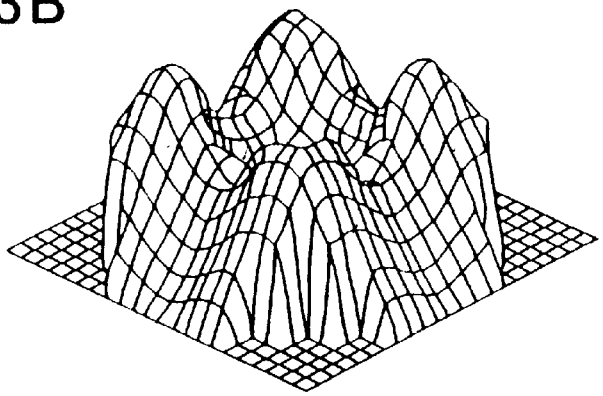
FIG. 13A is a view of the distribution of the light intensity on the fly-eye lens surface by numerical values.
FIG. 13B is a view showing three-dimensionally the distribution of the light intensity on the fly-eye lens surface.

In the present embodiment, a distribution of the light intensity shown in FIG. 12 can be realized at the incident surface to the fly-eye lens 37. If the distribution of the light intensity shown in FIG. 12 can be realized at the incident surface to the fly-eye lens 37, the distribution of intensity of the emitted light from the fly-eye lens serving as the effective light source exhibits a similar distribution. Note that, FIG. 13A is a view of the distribution of intensity of the light incident upon the fly-eye lens by numerical figures. The asterisked portions indicate the peak portions of the light intensity, while the numerals of 0 to 9 indicate a proportion of the light intensity where the peak portion is 10. The distribution of the light intensity exhibited is one that is low at the center portion and high at the peripheral portion. Also, FIG. 13B is a three-dimensional view of the distribution of the light intensity shown in FIG. 13A.

In the present embodiment, the distribution of the light intensity shown in FIG. 13B is realized, and the light source changing means shown below is adopted so as to make the distribution of the light intensity thereof variable.

Figure 14A:
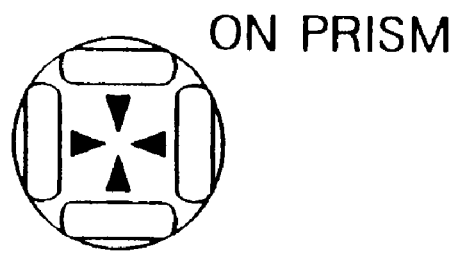
FIG. 14A is a view of a beam state on the prism.
Figure 14B:
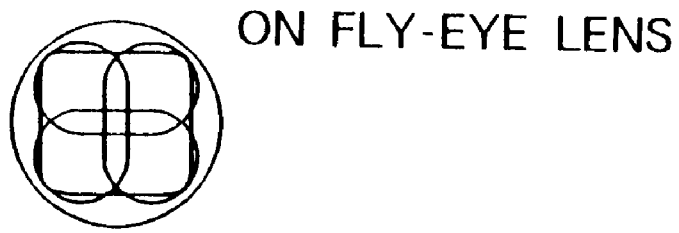
FIG. 14B is a view of the superimposition of the beam on the fly-eye lens.
Figure 14C:
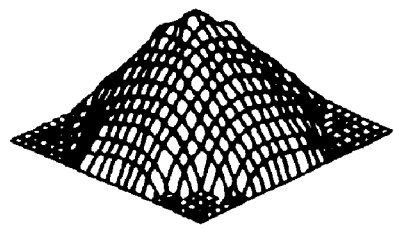
FIG. 14C is a view of a Gaussian distribution of the amount of light.

The distribution of the amount of light at the surface of the fly-eye lens of a stepper of related arts is a Gaussian distribution of the amount of light in which the center portion is high and the peripheral portions are low as shown in FIG. 14C. This is because, as shown in FIG. 14A, the light split by the beam splitter 35 is combined by the prism as shown in FIG. 14B.

Since the distribution of the amount of light shown in FIG. 14C was exhibited, there was a disadvantage that the light effective for a rough pattern was strong and, simultaneously, the light for generating a secondary peak on the surface of the wafer 41 and effective for a fine pattern was weak.

In order to solve this disadvantage, the light intensity at the center portion of the fly-eye lens was gradually reduced and the obliquely incident component was emphasized so that the secondary peak, which was the disadvantage in the halftone phase shift mask, was not generated. More specifically, the beam splitter 35 shown in FIG. 12 was used, as shown in FIG. 15A, to split the beam 42 and these resultant beams were superimposed on each other by using the prism unit 36 shown in FIG. 12 (refer to FIG. 15B) so as to reproduce the desired distribution of the light intensity in the present embodiment on the surface of the fly-eye lens.

Figure 15A:
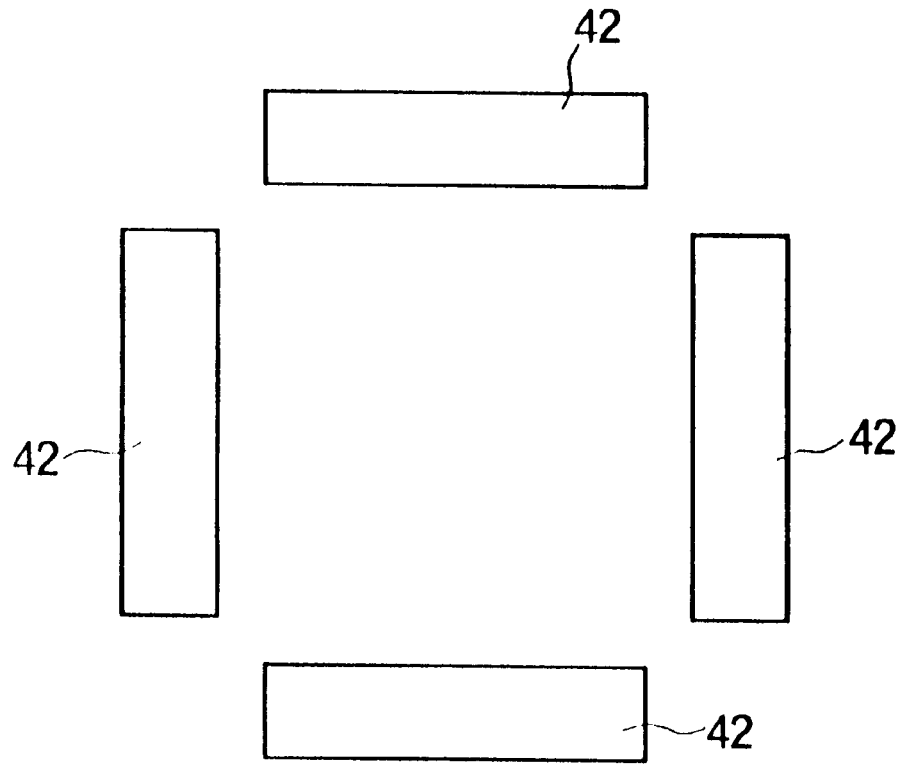
FIGS. 15A and 15B are views of the method of superimposing the beam; where
Figure 15B:
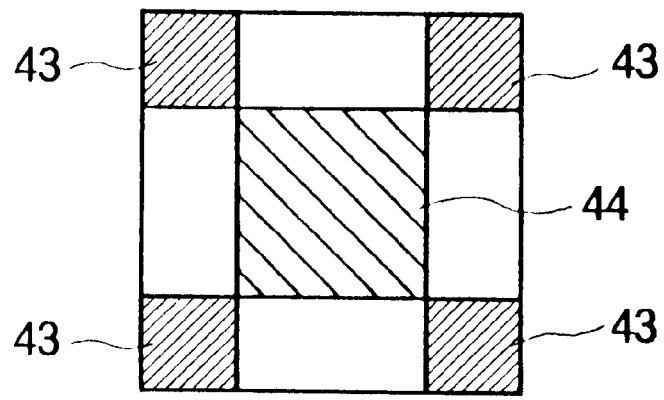

In FIG. 15A, the shape of the light source after the superimposition can be changed according to the amount of inward shift of the beams 42 before the superimposition and the dimensions of the beams in the short length direction. In FIG. 15B, the four corner portions 43 are portions where the light is superimposed and therefore are portions which becomes the peak portions of the amount of light. In the center portion 44, there is light due to the leakage of the beams, but the amount of that light is low.

In the present embodiment, the device shown in FIGS. 10 and 11 was added to the exposure apparatus so as to achieve the optimization of the distribution of intensity of the light for exposure emitted from the fly-eye lens 37 serving as the effective light source shown in FIG. 12.

As shown in FIGS. 10 and 11, on the wafer stage 50, a diagnostic region 54 is provided outside of a wafer chuck 52 holding the wafer 41. In the present embodiment, the diagnostic region 54 is constituted by a photochromic material. A photochromic material is a material whose surface changes in color substantially proportionally to the amount of illuminated light in the exposure waveform used. Accordingly, by exposing this surface, the pattern is transferred from the reticle 39 shown in FIG. 12. As the reticle 39, a phase shift mask is used. It is also possible to use as the reticle 39 the mask for the actual device on which the intended final pattern is to be formed as it is, and it is also possible to use a mask on which only the inspection pattern is formed or use a mask on which the inspection pattern is formed on the periphery of the final pattern. The inspection pattern is not limited to one type and preferably includes a plurality of types of patterns including at least isolated patterns and closely packed patterns. This is for the detection and comparison of the secondary peaks of a plurality of types of patterns.

The wafer stage 50 shown in FIGS. 10 and 11 is provided so that it can be moved in the plane direction thereof. At the position where the wafer chuck 52 is located beneath the projection lens 40, an off axis scope 56 serving as the photographic apparatus is arranged on the diagnostic region 54. The scope 56 has an object lens 58 and a CCD camera 60, photographs the pattern formed in the diagnostic region 54, and converts this to a video signal. The photographed video signal is transmitted to a computer 62, subjected to signal processing, and stored in the memory corresponding to the data in the form of the light source at this point of time.

Next, an explanation will be made of the method of using the exposure apparatus according to the present embodiment.

Before the exposure of the intended final pattern, the distribution of the light intensity of the effective light source is optimized by the procedure shown next.

(1) First, the wafer stage 50 is moved so that the diagnostic region 54 constituted by the photochromic material shown in FIG. 10 is located beneath the projection lens. Next, the exposure is carried out by the best focus by using the reticle 39 constituted by the halftone phase shift mask shown in FIG. 12 so as to transfer the inspection pattern onto the diagnostic region 54.

(2) Next, the wafer stage 50 shown in FIG. 10 is moved to locate the diagnostic region 54 beneath the object lens 58. Then, the inspection pattern formed on the diagnostic region 54 is photographed and converted to a video signal. The photographed video signal is transmitted to the computer 62, subjected to signal processing, and stored in the memory corresponding to the data in the form of the light source at this point of time.

(3) Next, the optical element such as the beam splitter 35 shown in FIG. 12 is controlled to change the distance between the split beams 42 shown in FIG. 15 or change the dimensions of the beams 42 in the short direction and thereby change the shape of the distribution of intensity of the light for exposure emitted from the fly-eye lens 37 serving as the effective light source. The operations of (1) and (2) described above are repeated in the same way as described before except that use is made of the light for exposure having that changed distribution.

Figure 16:
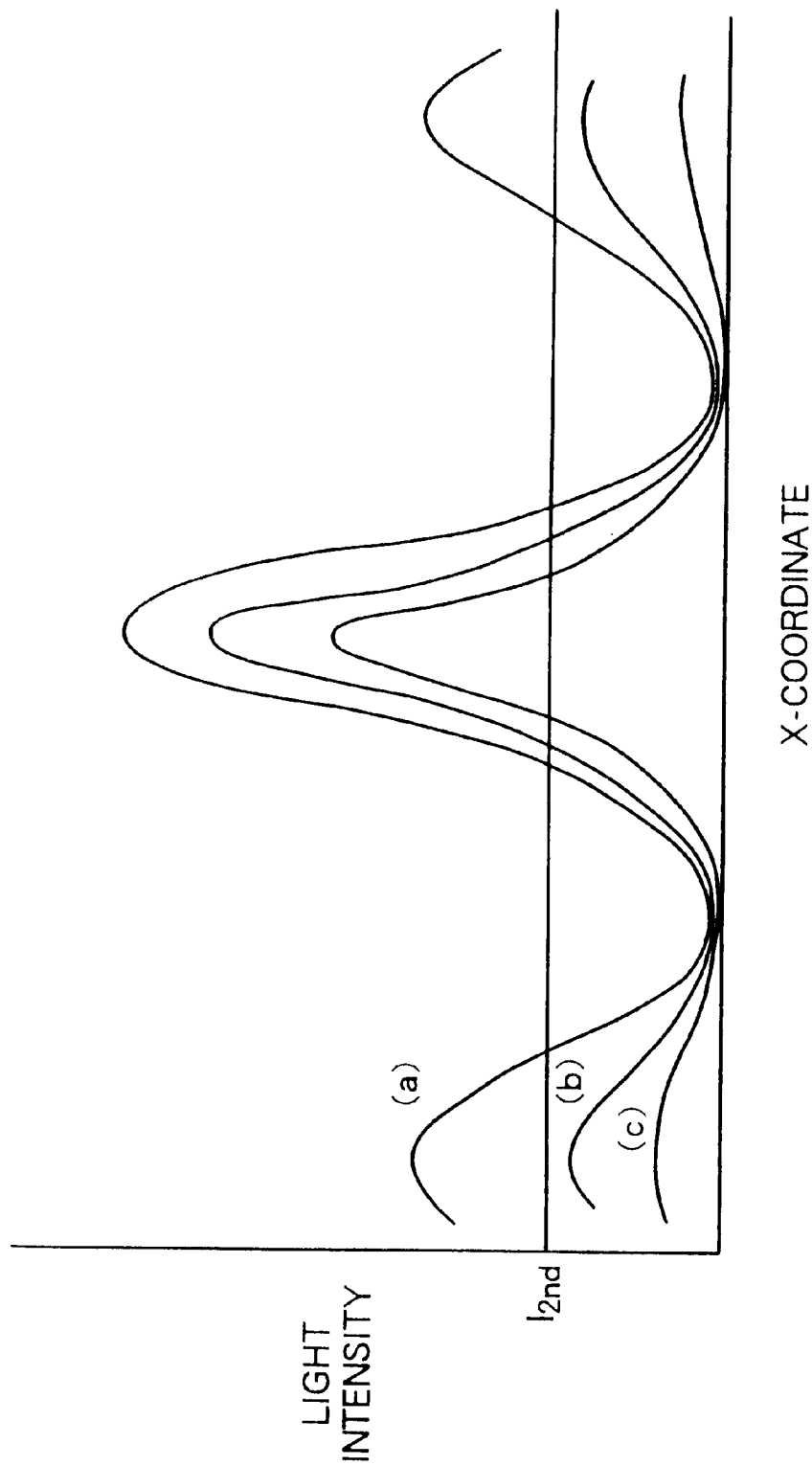
FIG. 16 is a graph showing a contrast curve obtained for every shape of the light source.

Next, the contrast curves (a) to (c) shown in FIG. 16 are drawn for every shape of the light source, and that data is stored in the memory of the computer 62 shown in FIG. 10 for every light source. In the computer 62, a slice level $I_{2nd}$ shown in FIG. 16 is preliminarily stored. This slice level $I_{2nd}$ is the level of light intensity at which the secondary peak is resolved on the resist. This level differs depending upon the type of the resist which is used etc.

The computer selects from among a plurality of contrast curves (a) to (c) stored a contrast curve (b) with which the secondary peak does not exceed the slice level $I_{2nd}$ and the primary peak becomes maximum and decides on the distribution of the light intensity of the effective light source in that case as the optimum value.

In the present embodiment, the distribution of the light intensity of the effective light source corresponding to the contrast curve (a) shown in FIG. 16 was the distribution of the light intensity of the normal illumination shown in FIG. 14C. Also, the distribution of the light intensity of the effective light source corresponding to the contrast curve (b) shown in FIG. 16 was the distribution of the light intensity obtained by lowering the light intensity of the center portion by 2 to 90 percent with respect to the peak value of the light intensity of the peripheral portion as shown in FIG. 13. Further, the distribution of the light intensity of the effective light source corresponding to the contrast curve (c) shown in FIG. 16 was the distribution of the light intensity of the ring belt illumination obtained by setting 0 as the light intensity of the center portion and strengthening the light intensity of the peripheral portion as shown in FIG. 8C.

In the present embodiment, since the contrast curve (b) shown in FIG. 16 was selected, it was decided that the shape of the light source shown in FIG. 13 was the optimal one.

Next, exposure was carried out by combining the light source having the distribution shown in FIG. 13 with the halftone phase shift mask so as to actually form the pattern on the wafer. The results are shown in FIG. 8B. Also, for comparison, the result of forming a pattern by combining the usual illumination with the halftone phase shift mask is shown in FIG. 8A. Further, for comparison, the result of forming a pattern by combining the ring belt illumination with the halftone phase shift mask is shown in FIG. 8C. As shown in FIG. 8B, where the shape of the light source obtained by the present embodiment was used, almost no resolution due to the secondary peak was seen even if the pattern interval became dense.

Figure 17:
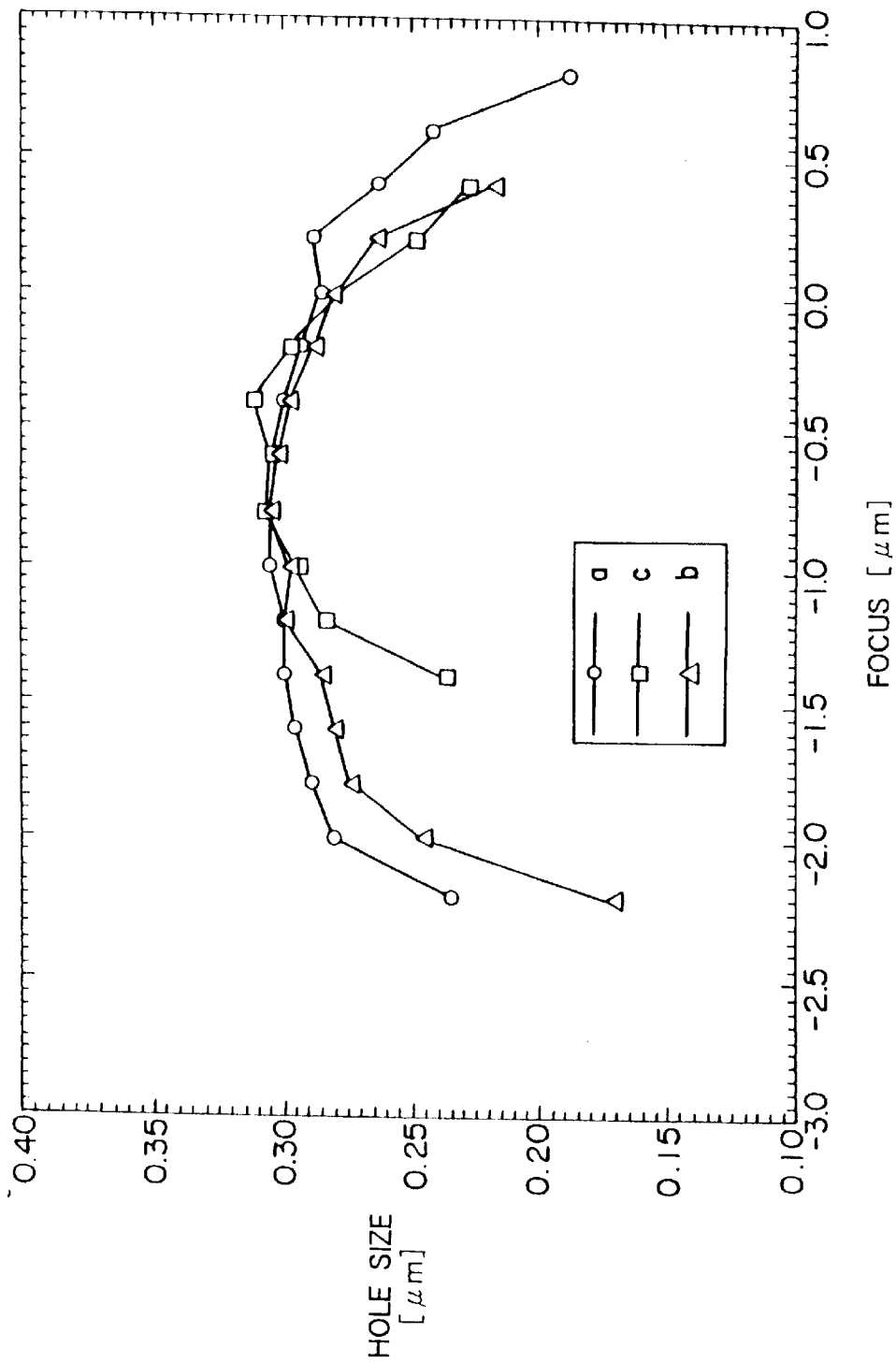
FIG. 17 is a graph showing that the DOF is also improved in the case of the shape of the light source obtained by the process according to the embodiment of the present invention.

Also, as indicated by a curve b in FIG. 17, it was confirmed that where the shape of the light source obtained by the present embodiment was used and isolated patterns were formed, although not to the extent of the case of the usual illumination (curve a), the DOF was increased compared with the case of the ring belt illumination (curve c).

Namely, it was confirmed that by using the shape of the light source obtained by the present embodiment, the resolution of the secondary peak could be suppressed without reducing the effect of the halftone phase shift mask.

Second Embodiment

In the present embodiment, a two-dimensional solid-state camera element such as CCD was directly arranged without arranging the photochromic material at the diagnostic region 54 shown in FIGS. 10 and 11 used in the first embodiment.

In the present embodiment, the off axis scope 56 becomes unnecessary, the light irradiated to the diagnostic region 54 is directly converted to a video signal and stored in the computer, etc. The rest of the configuration is the same as that of the first embodiment.

In the present embodiment as well, similar to the first embodiment, it was confirmed that the optimum shape of the light source could be found and that, at the formation of the pattern, the resolution of the secondary peak could be suppressed without reducing the effect of the halftone phase shift mask.

Third Embodiment

The present embodiment is the same as the first embodiment except that the diagnostic region is on the periphery of the silicon wafer (substrate) on which the final pattern is to be formed and the reflected light of the inspection pattern irradiated to this diagnostic region is photographed to detect the light intensity of the secondary peak.

In the present embodiment as well, similar to the first embodiment, the optimum shape of the light source could be found and, at the formation of the pattern, the resolution of the secondary peak could be suppressed without reducing the effect of the halftone phase shift mask.

Fourth Embodiment

In the present embodiment, when irradiating the light for exposure to the diagnostic region 54 as in the first embodiment, the light for exposure was irradiated under a plurality of focus conditions. When irradiating the light for exposure under these plurality of focus conditions, the distribution of intensity of the light from the light source was changed so that the light intensities of the secondary peaks detected under the different conditions all became not more than a predetermined values. A distribution of the light intensity of the light source giving not more than the predetermined value was adopted as the optimum distribution of the light intensity of the light source. The rest of the configuration is similar to that of the first embodiment.

In the present embodiment as well, the light source having a distribution shown in FIG. 13 was selected.

In the present embodiment as well, in the same way as in the first embodiment, the optimum shape of the light source could be found, and at the formation of the pattern, the resolution of the secondary peak could be suppressed without reducing the effect of the halftone phase shift mask.

Fifth Embodiment

In the present embodiment, the optimum shape of the light source was found in the same way as that for the first embodiment except a rim type phase shift mask, an outrigger type phase shift mask, or another mask than the halftone phase shift mask was used.

The rest of the configuration is similar to that of the first embodiment.

In the present embodiment as well, the light source having a distribution shown in FIG. 13 was selected.

In the present embodiment as well, similar to the first embodiment, the optimum shape of the light source could be found, and at the formation of the pattern, the resolution of the secondary peak could be suppressed without reducing the effect of the phase shift mask.

Sixth Embodiment

In the present embodiment, the optimum shape of the light source was found in the same way as that for the first embodiment except use was made of an optical element such as prism and an optical component arranged so that it can be moved toward and away from this optical element in the axial direction of the light path as the means for making the shape of the light source variable.

The rest of the configuration is similar to that of the first embodiment.

In the present embodiment as well, a light source having a distribution shown in FIG. 13 was selected.

In the present embodiment as well, similar to the first embodiment, the optimum shape of the light source could be found, and at the formation of the pattern, the resolution of the secondary peak could be suppressed without reducing the effect of the phase shift mask.

Seventh Embodiment

In the present embodiment, the optimum shape of the light source was found in the same way as that for the first embodiment except that, as the means for making the shape of the light source variable, use was made of a device having a means for dividing the beam incident upon the effective light source into two or more beams, a moveable mirror for irradiating the at least two divided beams onto the effective light source, and a scanning means for lowering the amount of light emitted from the center portion of the effective light source with respect to the peak value of the amount of light emitted from the peripheral portion of the effective light source by utilizing the difference in the scanning speed at the different points of the surface of the effective light source caused by the shape of the surface of the moveable mirror.

The rest of the configuration is similar to that of the first embodiment.

In the present embodiment as well, a light source having a distribution shown in FIG. 13 was selected.

In the present embodiment as well, similar to the first embodiment, the optimum shape of the light source could be found, and at the formation of the pattern, the resolution of the secondary peak could be suppressed without reducing the effect of the phase shift mask.

Eighth Embodiment

Figure 18A:
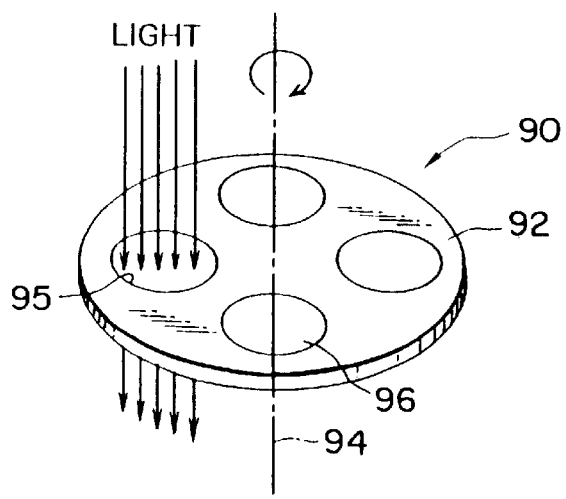
FIG. 18A to 18C are views of examples of the light source changing means.

In the present embodiment, the optimum shape of the light source was found in the same way as that for the first embodiment except use was made of the device shown in FIG. 18A as the means for changing the distribution of intensity of light from the light source obtained as a result. The rest of the configuration is similar to that of the first embodiment.

In the present embodiment, a filter switching device 90 of a rotary disk system shown in FIG. 18A is arranged on a light incident side or a light emitting side of the fly-eye lens 37 shown in FIG. 12. This filter switching device 90 has a rotary disk 92 and a rotary drive shaft 94 driving this. In the rotary disk 92, an opening portion 95 for transmitting the light, a filter 96, and another filter are formed along the circumferential direction. The filter 96 blocks out the light in the range of 0.5 of the center portion thereof where the outer diameter is set to for example 1.0 as shown in FIG. 19A.

Where one total exposure time was set to 1 second, in the first 0.2 second, the light for exposure (light having a distribution shown in FIG. 20) is passed through the opening portion 95 shown in FIG. 18A, and then the rotary disk 92 is instantaneously rotated. In the remaining 0.8 second, the exposure is carried out by passing the light for exposure through the filter 96. As a result, as shown in FIG. 20, the distribution of intensity of light from the effective light source per one exposure time becomes equal to the distribution of the light intensity of the sum of the product of the distribution of the light intensity and time shown in FIG. 20 and the product of the distribution of the intensity of light passed through the filter and the time shown in FIG. 19A.

In the present embodiment, by adjusting the balance between the time of passing the light through the opening portion 95 shown in FIG. 18A and the time of passing the light through the filter 96, it is possible to change the distribution of the amount of light irradiated (equivalent to the distribution of the light intensity) as a result.

In the present embodiment, a light source having the ring belt illumination shape was selected.

In the present embodiment as well, similar to the first embodiment, the optimum shape of the light source could be found, and at the formation of the pattern, the resolution of the secondary peak could be suppressed without reducing the effect of the phase shift mask.

Ninth Embodiment

Figure 18B:
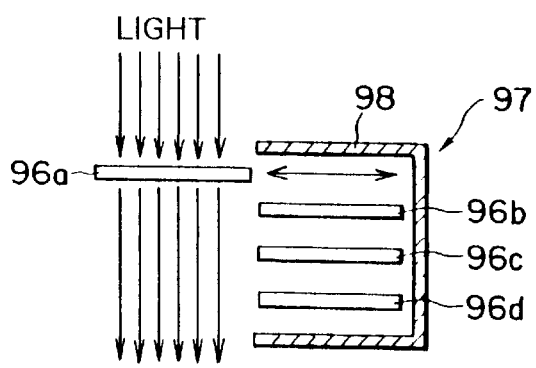

In the present embodiment, the optimum shape of the light source was found in the same way as that for the first embodiment except use was made of the device shown in FIG. 18B as the means for changing the distribution of the intensity of light from the light source obtained as a result. The rest of the configuration is similar to that of the first embodiment.

In the present embodiment, it is assumed that, in a state where the light is not passed through the filter, the distribution of intensity of the light incident upon the fly-eye lens 37 serving as the effective light source is the flat distribution of the light intensity as shown in FIG. 20.

Figure 22:
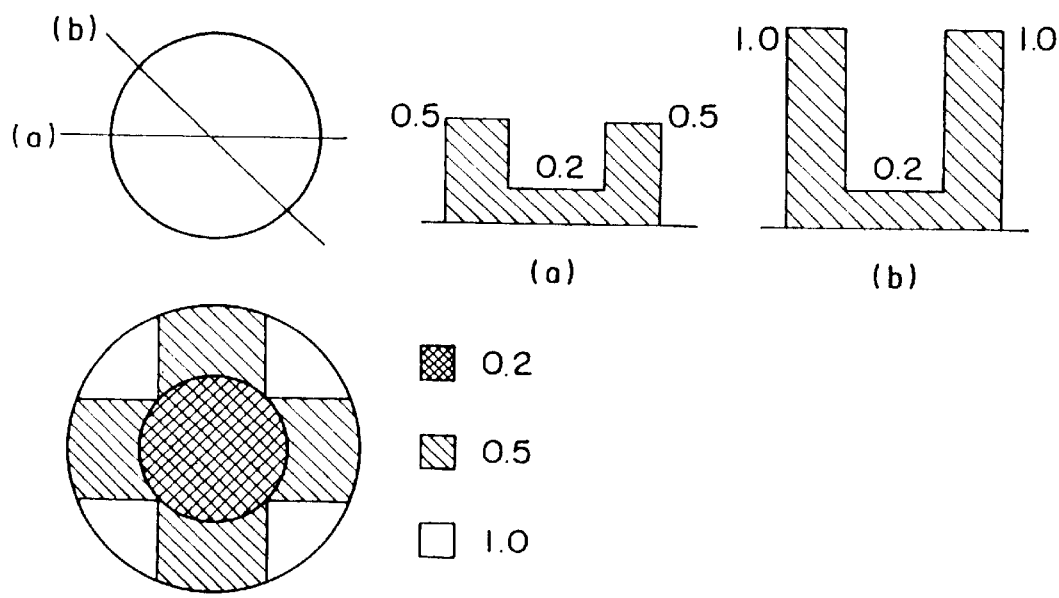
FIG. 22 is a conceptual view showing the addition of the distribution of the light intensity.

In the present embodiment, for example, a sliding type filter switching device 97 shown in FIG. 18B is arranged on the light incident side or the light emitting side of the fly-eye lens shown in FIG. 12. This filter switching device 97 accommodates a plurality of types of filters 96a to 96d and has a filter holding member 98 which can slide them at a high speed. The filter 96a blocks out the light in the range of 0.5 at the center portion thereof where the outer diameter is set to 1.0 as shown in for example FIG. 19A. Also, as shown in FIG. 19B, where the outer diameter is set to 1.0, the filter 96b blocks out the light in the range in the form of a cross having a width of 0.35.

Where one total exposure time is set to 1 second, in the first 0.2 second, a state where all filters 96a to 96d are retracted into the holding member 98 shown in FIG. 18B is exhibited and the light for exposure is not passed through the filter. Thereafter, the filter 96a is instantaneously slid, and in 0.3 second, the exposure is carried out by passing the light for exposure through the filter 96a. Next, the filter 96a shown in FIG. 18B is instantaneously slid and retracted into the holding member 98, and simultaneously the filter 96b is slid and moved out. In the remaining 0.5 second, the exposure is carried out by passing the light for exposure through the filter 96b. As a result, as shown in FIG. 22, the distribution of intensity of light from the effective light source per one exposure time becomes equal to the distribution of the light intensity of the sum of the product of the distribution of the light intensity and time shown in FIG. 20, the product of the distribution of intensity of light passed through the filter and the time shown in FIG. 19A, and the product of the distribution of intensity of light passed through the filter shown in FIG. 19B and time.

In the present embodiment, by adjusting the time of passing the light through the filters 96a to 96d shown in FIG. 18B and the point of time of switching, it is possible to change the distribution of the amount of light irradiated (equivalent to the distribution of the light intensity) as a result.

In the present embodiment, similar to the first embodiment, a light source having a shape shown in FIG. 13 was selected.

In the present embodiment as well, similar to the first embodiment, the optimum shape of the light source could be found, and at the formation of the pattern, the resolution of the secondary peak could be suppressed without reducing the effect of the phase shift mask.

Tenth Embodiment

Figure 18C:
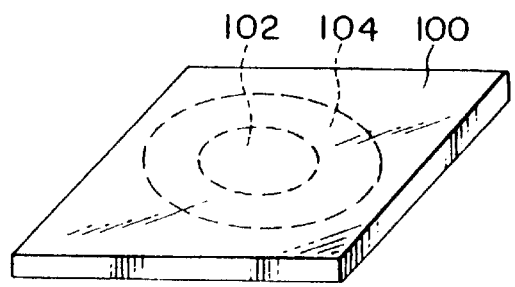

In the present embodiment, the optimum shape of the light source was found in the same way as that for the first embodiment except use was made of the device shown in FIG. 18C as the means for changing the distribution of the intensity of light from the light source obtained as a result. The rest of the configuration is similar to that of the first embodiment.

In the present embodiment, it is assumed that, in a state where the light is not passed through the filter, the distribution of the intensity of the light incident upon the fly-eye lens 37 serving as the effective light source is the flat distribution of the light intensity as shown in FIG. 20.

In the present embodiment, for example a light shutter type optical material 100 shown in FIG. 18C is arranged on the light incident side or the light emitting side of the fly-eye lens 37 shown in FIG. 12. This light shutter type optical material is made of for example PLZT (lead zirconate titanate added with La) and is a material which can be changed in the transmittance of light by providing a plurality of fine electrodes on at least one surface of the substrate and applying voltage. By suitably devising the shape of the electrodes provided on the surface of the optical material 100, the center region 102 and the periphery region 104 can be separately controlled, and by applying voltage, it is possible to instantaneously place only the center portion 102 into the light-blocking state.

Where one total exposure time is set to 1 second, in the first 0.2 second, the center portion 102 and the peripheral portion 104 shown in FIG. 18C are placed in the light transmission state, and the light for exposure is passed through these regions. Thereafter, voltage is instantaneously applied to only the electrodes of the center portion 102 to place the center portion 102 in the light-blocking state, and the light for exposure is passed in this state. As a result, a result similar to that of the seventh embodiment can be obtained.

In the present embodiment, by suitably devising the shape of the electrodes formed on the surface of the optical material 100, the interval of arrangement, the conditions for application of the voltage, etc., various distributions of the light intensity can be obtained as a result.

In the present embodiment, a light source having a shape shown in FIG. 13 was selected similar to the first embodiment.

In the present embodiment as well, in the same way as in the first embodiment, the optimum shape of the light source could be found and, at the formation of the pattern, the resolution of the secondary peak could be suppressed without reducing the effect of the phase shift mask.

Note that the present invention is not limited to the above embodiments and can be modified in various ways within the scope of the present invention.

For example, as the light source, an effective light source other than a fly-eye lens or other light sources can be used.

As explained above, according to the present invention, even if for example a phase shift mask is used, the pattern can be formed under the optimum light source conditions with little disadvantage of a secondary peak.

What is claimed is:

1. An exposure apparatus for forming a pattern on a substrate comprising:

a light source for emitting light for exposure;

a light source changing means for changing the distribution of intensity of the light emitted from said light source; and a secondary peak detecting means for detecting the secondary peak of the light for exposure irradiated on a diagnostic region, on which the light for exposure from said light source is irradiated through a mask so as to diagnose the distribution of light intensity of said light exposure, wherein said light source changing means changes the distribution of the intensity of light emitted from said light source based on the diagnosis of the distribution of light intensity.

2. An exposure apparatus as set forth in claim 1, wherein the light source comprises an laser light source.

3. An exposure apparatus as set forth in claim 1, wherein the mask comprises a phase shift mask.

4. An exposure apparatus as set forth in claim 1, wherein said diagnostic region is made of a photochromic material and said apparatus further comprises a photographic means for photographing the change of color of the surface of the material based on the distribution of intensity of the light for exposure irradiated to said photochromic material and said secondary peak detecting means detecting the light intensity of the secondary peak based on the result of the photographing of said photographic means.

5. An exposure apparatus as set forth in claim 1, wherein said diagnostic region is constituted by a photographic means which can detect the two-dimensional distribution of the light intensity, said secondary peak detecting means detecting the light intensity of the secondary peak based on the image photographed by said photographic means.

6. An exposure apparatus as set forth in claim 1, wherein said diagnostic region is formed on the periphery of said substrate on which a final pattern is to be formed and said second peak detecting means detecting the light intensity of the secondary peak by photographic the reflected light of an inspection pattern irradiated on said diagnostic region.

7. An exposure apparatus as set forth in claim 1, further comprises a controlling means for changing the distribution of the intensity of the light from the light source by the light source changing means so that the light intensity of the secondary peak becomes less than or equal to said predetermined value.

8. An exposure apparatus as set forth in claim 7, further comprises a controlling means for changing the distribution of the intensity of the light from the light source by the light source changing means so that a primary peak of the distribution of intensity of the light for exposure irradiated to said diagnostic region becomes greater than or equal to a predetermined value.

9. An exposure apparatus as set forth in claim 1, wherein said light source changing means comprises a means for lowering an amount of light emitted from the center portion of the effective light source to be equal to or lower than the amount of light emitted from the peripheral portion of the effective light source by a predetermined amount.

10. An exposure apparatus as set forth in claim 9, wherein the light source changing means comprises a means for making the amount of light emitted from the center portion of the effective light source lower than the peak value of the amount of light emitted from the peripheral portion of the effective light source by 0 to 90 percent.

11. An exposure apparatus as set forth in claim 9, wherein the effective light source compeises a fly-eye lens comprised of an assembly of a plurality of lenses and the light emitted from said light source is passed through said fly-eye lens to irradiate the effective light.

12. An exposure apparatus as set forth in claim 1, wherein the light source changing means has an optical element and optical components arranged to be moved toward or away from said optical element in an axial direction of the light path.

13. An exposure apparatus as set forth in claim 12, wherein the-optical element comprises a prism.

14. An exposure apparatus as set forth in claim 9, wherein the light source changing means has a means for dividing a beam incident upon the effective light source into two or more beams, a moveable mirror for irradiating the two or more divided beams onto the effective light source, and a scanning means for lowering the amount of light emitted from the center portion of the effective light source with respect to the peak value of the amount of light emitted from the peripheral portion of the effective light source by utilizing the difference of the scanning speed at different points of the surface of the effective light source caused by the surface shape of the moveable mirror.

15. An exposure apparatus as set forth in claim 9, wherein the light source changing means has a first filter having a higher transmittance at the peripheral portion than at the center portion and a switching means for switching between a state where the light is passed through said first filter and a state where the exposure is carried out without passing the light through this first filter within a single exposure time.

16. An exposure apparatus as set forth in claim 15, further comprising a second filter having a distribution of transmittance different from that of the first filter and wherein in a state where the exposure is carried out without passing the light through said first filter, said switching means is controlled so as to pass the light through said second filter.

17. An exposure apparatus as set forth in claim 15, wherein the switching means has at least a rotary disk on which said first filter is mounted and a driving means for driving said rotary disk to rotate.

18. An exposure apparatus as set forth in claim 15, wherein the switching means has at least a slide mechanism by which said first filter can move in a sliding manner.

19. An exposure apparatus as set forth in claim 15, wherein said switching means is formed by a light shutter type optical material with a transmittance of light which changes by application of a voltage.

* * * * *

UNITED STATES PATENT AND TRADEMARK OFFICE
CERTIFICATE OF CORRECTION

PATENT NO. : 5,982,476
DATED : November, 9, 1999
INVENTOR(S) : Masaya UEMATSU

It is certified that error appears in the above-identified patent and that said Letters Patent is hereby corrected as shown below:

Column 16, line 15 et seq., claim 11, should read as follows;
An exposure apparatus as set forth in claim 9, wherein the effective light source comprises a fly-eye lens comprised of an assembly of a plurality of lenses and the light emitted from said light source is passed through said fly-eye lens to irradiate the effective light.

Signed and Sealed this

Fourteenth Day of November, 2000

Attest:

Q. TODD DICKINSON

*Attesting Officer*  *Director of Patents and Trademarks*